(12) United States Patent
McIlwraith et al.

(10) Patent No.: US 6,601,888 B2
(45) Date of Patent: Aug. 5, 2003

(54) CONTACTLESS HANDLING OF OBJECTS

(75) Inventors: Lon McIlwraith, Delta (CA); Andrew Christie, Vancouver (CA)

(73) Assignee: Creo Inc., Burnaby (CA)

( * ) Notice: Subject to any disclaimer, the term of this patent is extended or adjusted under 35 U.S.C. 154(b) by 0 days.

(21) Appl. No.: 09/810,408

(22) Filed: Mar. 19, 2001

(65) Prior Publication Data

US 2002/0130524 A1 Sep. 19, 2002

(51) Int. Cl.[7] .................................................. B25J 15/06
(52) U.S. Cl. ....................................................... 294/64.3
(58) Field of Search ................................ 294/64.1, 64.2, 294/64.3, 65; 901/40; 414/627, 737, 752.1, 941; 271/90, 91, 97, 98, 195

(56) References Cited

U.S. PATENT DOCUMENTS

| | | |
|---|---|---|
| 3,438,668 A | 4/1969 | Olsson et al. |
| 3,466,079 A | 9/1969 | Mammel |
| 3,523,706 A | 8/1970 | Logue |
| 3,880,297 A | 4/1975 | Matrin |
| 4,667,948 A | 5/1987 | Angelbeck et al. |
| 4,878,799 A | 11/1989 | Seto et al. |
| 4,921,520 A | 5/1990 | Carlomagno |
| 4,969,676 A | 11/1990 | LaMagna |
| 5,067,762 A | 11/1991 | Akashi |
| 5,102,118 A  * | 4/1992 | Vits ........................ 226/196.1 |
| 5,470,420 A | 11/1995 | Yokajty |
| 5,798,825 A | 8/1998 | Banding et al. |
| 5,967,578 A | 10/1999 | Frey |
| 5,992,324 A | 11/1999 | Kohno et al. |
| 6,000,337 A | 12/1999 | Blake et al. |

FOREIGN PATENT DOCUMENTS

| | | |
|---|---|---|
| DE | 4038544 | 6/1992 |
| DE | 4105269 | 9/1992 |

OTHER PUBLICATIONS

Seybold Report on Publishing Systems vol.24,No. 20 (Jun. 26, 1995).

Barco Lithosetter Brochure, (May 1995).

Adams et al., Computer–to–Plate: Automating the Printing Industry pp. 143–150 (1996).

Llmburg, Essentials of Computer–to–Plate Technology, pp. 48–49 (1995).

(List continued on next page.)

*Primary Examiner*—Dean J. Kramer
(74) *Attorney, Agent, or Firm*—Oyen Wiggs Green & Mutala

(57) ABSTRACT

The present invention provides a method for the quiet, contactless handling of objects using pickup devices of the Bernoulli type. The method is particularly suitable for the contactless handling of items much larger than an individual pickup, for example the handling of lithographic printing plates. According to the method of the present invention, a flow of fluid is established between the pickup face of the Bernoulli pickup and the surface of the object to be supported. The fluid is made to flow over a laminar flow surface at a velocity sufficient to produce a pressure differential between the flowing fluid and a surrounding fluid medium. Bernoulli lift is maximized by making the laminar flow surface as smooth and protrusionúfree as possible, and by ensuring that the location and extent of the laminar flow surface substantially coincides with the maximal lateral limits of the low-pressure zone between the pickup face and the opposing object surface. As the pickup fluid flows beyond the periphery of the laminar flow surface, it flows over a vibrationúattenuating surface, reducing unwanted vibrations in the object.

39 Claims, 3 Drawing Sheets

OTHER PUBLICATIONS

ICG Titan 582 Brochure, May 1995.

Adams et al., Computer–to–Plate: Automating the Printing Industry pp. 159–170 (1996).

Adams et al., Computer–to–Plate : Automating the Printing Industry pp. 177–182 (1996).

Adams et al., Computer–to–Plate: Automating the Printing Industry pp. 135–143 (1996).

Mueller, Jochen et al. (2000) Smart card assembly requires advanced pre–assembly methods. Semiconductor International, Jul. 2000 [retrieved from web site]. Last accessed Mar. 13, 2001 <http://www.semiconductor.net/semiconductor/issues/issues/2000/200007/six0007/sez.asp>.

Neumann Technology—Float Chuck. Page from Neumann Technology web page, last accessed Mar. 13, 2001. <http://www.neumann.com.sg/fchuck.htm>.

[unknown author] (1972). Wafer pickup head. IBM Technical Disclosure Bulletin, Jan. 1972, p. 2311–2312.

Cunningham, G.F., and Lapine, S.A. (1976). Beveled Bernoulli head. IBM Technical Disclosure Bulletin, Sep. 1976, p. 1157.

* cited by examiner

CONTACTLESS HANDLING OF OBJECTS

FIELD OF THE INVENTION

This invention relates to the use of Bernoulli pickups for the contactless handling of objects. In particular, the present invention relates to the use of such devices in the field of printing and more specifically, to the handling of printing plates.

BACKGROUND OF THE INVENTION

There are many situations in which it is desirable to handle an object while eliminating or minimizing mechanical contact. This is particularly true when the physical condition of the surface of the object is a critical factor in the success or quality of an operation or product. Such situations are common in industries such as commercial printing, printed circuit board manufacture, and micro-lithography, which seek to make highly precise modifications to often delicate and mechanically sensitive surfaces.

In the printing industry, a typical example of a delicate and mechanically sensitive surface is the emulsion-coated imaging surface of a lithographic printing plate. Such plates typically comprise a substrate coated with one or more layers of radiation-sensitive material, frequently referred to as an emulsion. The coating of emulsion, particularly unexposed emulsion, is typically delicate and easily marred by mechanical contact. The marring, in turn, can produce undesirable artifacts in the final printed product. As a consequence, the printing industry is particularly concerned with methods to reduce the possibility of damage-inducing mechanical contact with the imaging surfaces of printing plates.

While damage to the imaging surface of a printing plate can occur at any point in the life of the plate, the surface is particularly vulnerable during operations requiring the movement of an individual plate from one location to another. This is especially true of imaging operations, during which an individual plate must typically be lifted from a stack of plates and then transported to or through the imaging device. This is not a trivial operation, as printing plates, though delicate, also tend to be quite large (50"×60" is a commonly available size). Mar-free handling of plates is further complicated by the fact that the topmost and therefore most accessible surface presented by a plate or stack of plates is typically the imaging surface, making the most likely candidate for a handling surface also the least desirable one.

PRIOR ART METHODS FOR THE HANDLING OF PRINTING PLATES

In automated or semi-automated systems for handling printing plates, a number of approaches are commonly used. One main approach is to use mechanical methods to transport plates. In order to minimize the possible damage caused by mechanical handling, prior art methods of this type have relied upon mechanisms to either reduce the amount of contact with the imaging surface or to reduce the mechanical impact imposed by such contact.

Methods to reduce contact between transport mechanisms and the imaging surface include employing gravity for at least part of the transport, handling plates by the edges only, or restricting contact as much as possible to the bottom (non-imaging surface) of the plate. Such methods do not completely eliminate the possibility of damage imposed by mechanical contact with plates, as plates may be warped, bent, scratched, or dented by gripping, dropping, or conveying operations. The imaging surface is particularly vulnerable during attempts to remove an individual plate from a stack of plates, given the aforementioned problem that the most accessible surface of a stacked plate is generally an imaging surface. In such situations, not only is the uppermost plate vulnerable to damage from mechanical impact, but also the imaging surface of plate immediately below it.

Methods to reduce the mechanical impact of the gripping and transport mechanisms include padding the plate-contacting portions of the mechanisms with soft or resilient materials, as well as keeping the amount of force used to perform these operations to acceptable minimums. None of these methods, however, eliminate the risks imposed by mechanical handling, as mechanical contact with the plates must still occur.

The other main approach is to use vacuum to move and hold printing plates. This approach is employed because vacuum methods generally do not require extensive mechanical handling of objects to be moved, and because vacuum cups (also referred to as suction cups) are often made of relatively soft and resilient materials in order to enhance the seal they make with a surface. However, picking up a plate using a vacuum still requires mechanical contact in order to establish the necessary seal, and the physical impingement of a vacuum cup can be just as effective in marring an imaging surface as the impact of a careless hand or a mechanical gripper.

Ideally, methods used to lift and transport printing plates should be contactless, eliminating the requirement for mechanical contact with the printing surface. Potential methods of this type include levitation using magnetic fields, electrostatic fields, or air bearings. However, the use of magnetic forces to lift plates imposes a requirement that the plates be susceptible to electromagnetic forces. This is a requirement that is not substantially met by many plate types, particularly those that employ non-metallic substrates such as rubber or polyester. Electrostatic levitation is similarly limited, given the requirement that the plate be able to hold an electrostatic charge. Unwanted electrostatic discharges may also pose a risk to the surface of the plate. Flotation of plates on air bearings, an example of which is disclosed in U.S. Pat. No. 5,798,825, is an attractive method. However, air bearings do not address the problem of lifting a plate from a stack without causing damage to imaging surfaces.

BERNOULLI PICKUPS

Another possible method for the contactless handling of lithographic plates comes from the semiconductor industry. This method, long known in that industry, employs the well-known Bernoulli principle in order to lift and hold delicate objects such as semiconductor wafers. Pickup devices that employ this method are commonly known as Bernoulli pickups.

Bernoulli pickups are essentially pressurized fluid devices that can be used to pick up objects by creating pressure differentials between the surface of an object and a surrounding fluid medium such as air. These manipulators utilize the Bernoulli effect by forcing a fluid, typically a gaseous fluid such as air, to flow under positive pressure between the surface of the pickup device and the object to be lifted. A schematic view of a typical Bernoulli pickup, well known in the prior art, is shown in FIG. 1. In FIG. 1, Bernoulli pickup 1 comprises a pickup head 3 coupled to a positive pressure pickup fluid source 5. The pickup fluid 7, typically a gas, flows through pickup head 3 via a shaft 9, emerging from the pickup head 3 via an orifice 11. When the pickup head 3 is positioned in close proximity to an object surface 13, pickup fluid 7 is forced to flow through the space 15 between a pickup face 17 and object surface 13. Arrows indicate the general direction of flow for pickup fluid 7.

The flow of pickup fluid 7 out of pickup head 3 toward the outer edges of pickup face 17 creates a low-pressure region 19 (shown schematically in FIG. 1) between pickup device 3 and object surface 13. This low-pressure region 19 is formed in accordance with the Bernoulli principle, as flowing pickup fluid 7 moves through space 15 at a higher velocity than the surrounding fluid medium. Region 19 within space 15 is thus at a lower pressure relative to the surrounding medium. The force resulting from this pressure differential will be normal to object surface 13. If sufficient to overcome opposing forces (such as gravity) acting on object 21, this force can be used to lift object 21. in this disclosure, the force on the object resulting from the action of the Bernoulli effect will be referred to as "Bernoulli lift".

Note that low-pressure region 19 does not necessarily extend to the limits of pickup face 17. This is because the velocity of the fluid 7 flowing through space 15 decreases as it flows toward the outer edges of the pickup face 17. Surrounding medium 25 will also have a tendency to flow toward low-pressure region 19, further slowing fluid 7. Thus, the pressure of the fluid 7 at the outer edges of the pickup face 17 will approach the pressure of the surrounding medium 25, and there may be portions at the periphery of pickup face 17 that do not contribute to generation of Bernoulli lift.

The magnitude of the Bernoulli lift generated depends on several factors, including the flow rate of the fluid being supplied by the positive pressure fluid source, the density of the fluid, the diameter of the pickup shaft and the pickup orifice, the proximity of the pickup surface relative to the object surface, and the pressure of the surrounding medium. Also important, though possibly not essential, is the extent to which the positive pressure fluid can maintain a pattern of laminar flow as it passes through the space between the pickup face and the object. Surface features that tend to disrupt laminar flow and promote turbulent flow, such as sharp protrusions or abrupt edges, will tend to reduce the amount of Bernoulli lift that can be generated with a given Bernoulli pickup.

Bernoulli pickups employing the basic mechanisms described above were suggested for use in the semiconductor industry during the 1960s and 70s. Patents such as U.S. Pat. No. 3,438,668 (Olsson et al.), U.S. Pat. No. 3,466,079 (Mammel), U.S. Pat. No. 3,523,706 (Logue), and publications such as "Wafer Pickup Head" (Leoff et al., IBM Technical Disclosure Bulletin, January 1972), exemplify the basic approach. Examples of Bernoulli pickups for semiconductor handling can also be purchased; one example is the "Float Chuck" distributed by Neumann Technology at 79 Loyang Way in Singapore. The SEZ group, a major supplier of semiconductor fabrication devices based in Villach, Austria, also employs the Bernoulli principle to ensure the contactless handling of thin semiconductor wafers (e.g., see U.S. Pat. No. 5,967,578, and the article "Smart Card Assembly Requires Advanced Pre-Assembly Methods", Semiconductor International, July 2000).

Aside from their use in the semiconductor industry, however, the use of Bernoulli pickups for contactless handling of materials is rare in industrial settings. A few patents, for example U.S. Pat. No. 3,880,297, U.S. Pat. No. 4,921, 520, and U.S. Pat. No. 5,470,420 teach the use of Bernoulli pickups to handle other materials, such as sheets of glass and pressure sensitive labels. These methods, however, are not widely used. In particular, the use of Bernoulli pickups to move large and relatively heavy items such as lithographic printing plates is almost unknown as an industrial method, although U.S. Pat. No. 3,880,297 and U.S. Pat. No. 4,921, 520 do propose such methods for moving glass plates. Neither of these last two patents, however, address crucial practical problems encountered when Bernoulli pickups are used to lift lithographic printing plates.

SPECIAL TECHNICAL CONSIDERATIONS FOR LARGE, PLATE-LIKE OBJECTS

Part of the difficulty with using conventional Bernoulli pickups to handle printing plates is that conventional Bernoulli pickups are not well suited for handling very large sheets of delicately surfaced material. This is primarily because most of the existing art with respect to the use of Bernoulli pickups comes from the semiconductor industry, where the objects handled (semiconductor wafers) are generally much smaller than a typical lithographic printing plate. A large semiconductor wafer, for instance, might be up to 30 cm across; a large lithographic printing plate, on the other hand, may be as large as 130 to 170 cm across (50 to 60 inches). At present, design variations in Bernoulli pickups are generally directed toward (a) preventing lateral movement of objects, (b) decreasing the likelihood of contact with the object surfaces, (c) increasing the lifting capability of the Bernoulli pickup, and (d) stabilizing the object while it is being supported by the Bernoulli pickup. While improvements in Bernoulli pickup design from the semiconductor industry may also be applicable to the lifting of large lithographic printing plates, it is also the case that printing plates and similar objects present problems not typically encountered with semiconductor wafers.

The large surface areas of printing plates means that the pickups used to manipulate them will likely be considerably smaller than the plates. While it may be possible to construct a single Bernoulli pickup or an array of Bernoulli pickups large enough to cover the entire surface of the plate, the enormous pressurized fluid consumption required to maintain a low pressure zone over the entire surface area of a plate would make the operation of such an apparatus expensive and impractical. If only a few Bernoulli pickups are used to support a lithographic printing plate, it is quite likely that large portions of the plates will be unsupported. These unsupported portions will be free to flex and bend in response to forces such as gravity.

At the smaller scales required by semiconductor wafers, a primary concern is the restriction of the lateral movement of the wafer. As a result, many Bernoulli pickups for this industry employ sidewalls, extensions, prongs, or other measures to keep the wafer from sliding away from the pickup face. Examples of such features can be found in U.S. Pat. No. 4,969,676 and the IBM Technical Disclosure Bulletin entitled "Beveled Bernoulli Head" (Cunningham et al., September 1976). While such protrusions are suitable for handling objects whose perimeters fit within the boundaries defined by the protrusions, they are not suitable for handling large flat objects with delicate surfaces that extend beyond such protrusions, as the protrusions will not clear the edges of the objects during the operation of the Bernoulli pickups. Such protrusions, if present, can increase the risk of marring.

Printing plates, being substantially larger than typical semiconductor waters, also require more lifting force. An individual printing plate is also typically lifted from a stack of printing plates, so additional lifting force may also be necessary to separate an individual plate from the plate below it. Thus, while a lifting force equivalent to just a few grams may be sufficient to manipulate a semiconductor wafer, a lifting force equivalent to at least a half kilogram may be necessary to lift a printing plate.

For a given Bernoulli pickup, the additional force required to lift a heavier item can be generated by increasing the pressure differential between surrounding atmosphere and the space immediately between the pickup face and the object surface. The most obvious way to do this is to increase the velocity of the pickup fluid flow as it passes through the space between the pickup face and the surface of the object, for instance by increasing the pressure at which the positive pressure pickup fluid is fed to the Bernoulli pickup. This method is naturally limited by the pressure of the gas supply and related constraints, such as the need to limit the consumption of pressurized fluid. In many machines, the limitation of compressed air consumption by a particular process can be a vital consideration, particularly if the compressed air supply is necessary for several operations performed by the same machine.

Another possible method of increasing lifting force is to design the Bernoulli pickup face to incorporate additional features that encourage the formation of additional low pressure zones. Akashi (U.S. Pat. No. 5,067,762) and LaMagna (U.S. Pat. No. 4,969,676) both teach the use of a cavity in the pickup face in the area immediately surrounding the exit orifice of the positive pressure gas. Such cavities are reported to improve the stability of semiconductor wafers lifted with devices, possibly because the cavity helps to create a larger air cushion between the pickup and the wafer. It has also been suggested that the cavity becomes an additional zone of low pressure when the positive pressure fluid increases in speed as it leaves the cavity and passes through the relatively narrow space between the Bernoulli pickup face and the object surface. However, it is not clear whether such cavities do in fact increase lifting force, as the gains produced may be offset by losses in pickup fluid velocity within such cavities. The incorporation of such features also makes the three dimensional shape of a Bernoulli pickup more complex, reducing ease of manufacture.

Attempts to use conventional Bernoulli pickups with large, flat, thin objects such as lithographic printing plates also reveal an additional problem, one unlikely to have been encountered within the semiconductor industry. Prior art Bernoulli pickups, with pickup surfaces similar to that depicted in FIG. 1, produce high frequency, high intensity (approximately 110 db) sonic emissions when used to pick the large thin lithographic printing plates, whose base substrates are commonly made of aluminum. These emissions arise as a result of interactions between the conventional Bernoulli pickups, the flow of pickup fluid, and the plates themselves. The large, thin, elastically deformable surfaces of the plates function as huge resonators, maintaining and amplifying sound waves to unacceptable, ear-damaging intensities. This particular shortcoming is one that appears not to have been encountered in prior art uses of Bernoulli pickups, which is perhaps not surprising given that most of the art is directed at the manipulation of small, fragile objects such as semiconductor wafers. Unfortunately, it is also the case that prior art methods and apparatus do not address this particular problem.

The use of Bernoulli pickups for lifting a large, flat object such as a lithographic printing plate thus creates a set of technical requirements not typically encountered within the context of the semiconductor industry. First, it is necessary to ensure that the methods used when employing Bernoulli pickups for large objects will produce sufficient lifting forces. Second, marring of the surface by the Bernoulli pickup may be more likely than it would be for an object that is small enough to fit underneath the pickup, particularly if the Bernoulli pickup has protrusions on or near its face. Third, the larger forces required to lift objects of printing plate size tend to translate into higher requirements for pressurized fluid flow—that is, Bernoulli pickup systems for lifting large objects can be expected to consume much more pressurized gas than systems designed for lifting small, lightweight objects. At the same time, pressurized gas consumption by a single process within a machine may need to be limited if pressurized gas is used to drive other processes in the machine. Fourth, unwanted sonic emissions produced by the interaction of Bernoulli pickups with lithographic printing plates must reduced or eliminated. All of these requirements must be taken into consideration when designing a method for contactless handling of large flat objects using Bernoulli pickups.

OBJECTS AND ADVANTAGES

It is the object of the current invention to provide a method for the contactless handling of articles using pickup devices of the Bernoulli type. More particularly, it is an object of the current invention to provide a method for the contactless handling of lithographic printing plates. Further objects and advantages of the present invention will become apparent upon consideration of the drawings and the ensuing description.

FIG. 2C shows an isometric view of a pickup head according to an alternative embodiment of the invention which comprises bristles on the pickup surface.

FIG. 2D shows an isometric view of the pickup head of a device according to a further alternative embodiment of the invention which includes a plurality of orifices.

BRIEF SUMMARY OF THE INVENTION

The present invention provides a method for the quiet, contactless handling of objects using pickup devices of the Bernoulli type. The method is particularly suitable for the contactless handling of items much larger than an individual pickup, for example, the handling of lithographic printing plates. According to the method of the present invention, a flow of fluid is established between the pickup face of the Bernoulli pickup and the surface of the object to be supported. The fluid is made to flow over a pickup surface at a velocity sufficient to produce a pressure differential between the flowing fluid and a surrounding fluid medium. In the preferred embodiment, Bernoulli lift is maximized by making a portion of the pickup surface as smooth and protrusion-free as possible, and by ensuring that the location and extent of smooth surface substantially coincides with the maximal lateral limits of the low-pressure zone between the pickup face and an opposing object surface. As the pickup fluid flows beyond the periphery of the low pressure zone, it flows over a vibration-attenuating surface, reducing unwanted vibrations in the object.

DETAILED DESCRIPTION OF THE PREFERRED EMBODIMENT

Figure 2A:
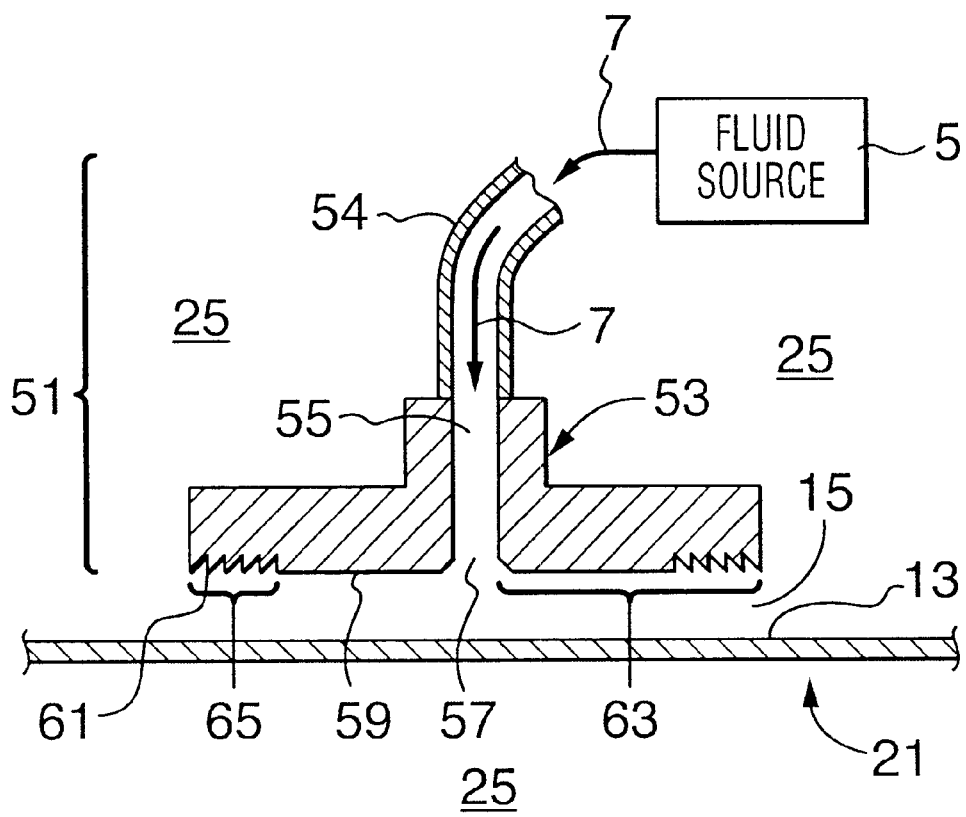
FIG. 2A is a schematic cross-sectional view of a Bernoulli pickup designed in accordance with the methods of the invention.
Figure 2B:
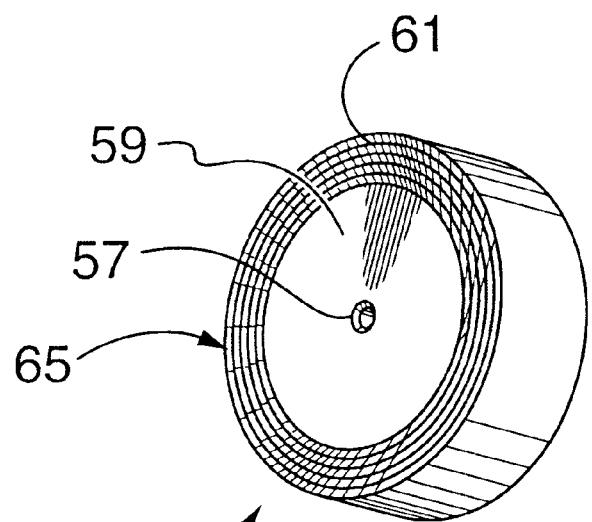
FIG. 2B is an isometric view of the pickup head of the Bernoulli pickup depicted in FIG. 2A. The pickup head is turned to show the pickup surface. The pressurized gas feed, the object to be handled, and the pickup shaft are not shown.

FIGS. 2A and 2B show two different views of the preferred embodiment of the present invention. FIG. 2A shows a cross-sectional view of a device functioning in accordance with the method of the present invention, while FIG. 2B shows an isometric projection of the pickup head showing the distinguishing features of the pickup surface.

In accordance with method of the invention, the preferred embodiment depicted in FIG. 2A shows a Bernoulli pickup 51 comprising a pickup head 53, a positive pressure source of pickup fluid 5, and fluid supply line 54. Bernoulli pickup 51 is utilized by placing it in close proximity to object 21, such that a gap 15 is formed between object surface 13 and pickup face 63. During operation, positive pressure fluid source 5 supplies pickup fluid 7 under positive pressure such that pickup fluid 7 flows through fluid supply line 54 into pickup shaft 55 and out of pickup orifice 57. The positive pressure applied by positive pressure fluid source 5, coupled with the proximity of object surface 13, deflects pickup fluid 7 so that its flow radiates outwards from orifice 57 to the outer edges of pickup head 53. The positive pressure of the flowing pickup fluid 7 coupled with the constriction provided by gap 15 is associated with an increase in velocity of pickup fluid 7 in the portion of gap 15 immediately surrounding, but not directly beneath, pickup orifice 57. This increase in velocity is in turn associated with a drop in fluid pressure relative to that of the surrounding medium 25, resulting in the production of Bernoulli lift.

The present invention incorporates the use of at least two separate functional zones on the surface of pickup face 63. As pickup fluid 7 exits from orifice 57, it is forced under pressure past a first flow surface, also referred to in this disclosure as Bernoulli lift zone 59, then past a vibration attenuation zone 65 comprising one or more vibration attenuation features 61. In the preferred embodiment, Bernoulli lift zone 59 is a surface with a surface profile that is made as smooth and projection-free as possible. The smooth surface profile is thought to prevent the disruption of laminar flow in pickup fluid 7, thus helping to ensure that pickup fluid 7 flows at high velocity through gap 15 in the vicinity of Bernoulli lift zone 59. The maximization of high velocity flow, in turn, helps to maximize the pressure differential between gap 15 and surrounding medium 25.

Figure 1:
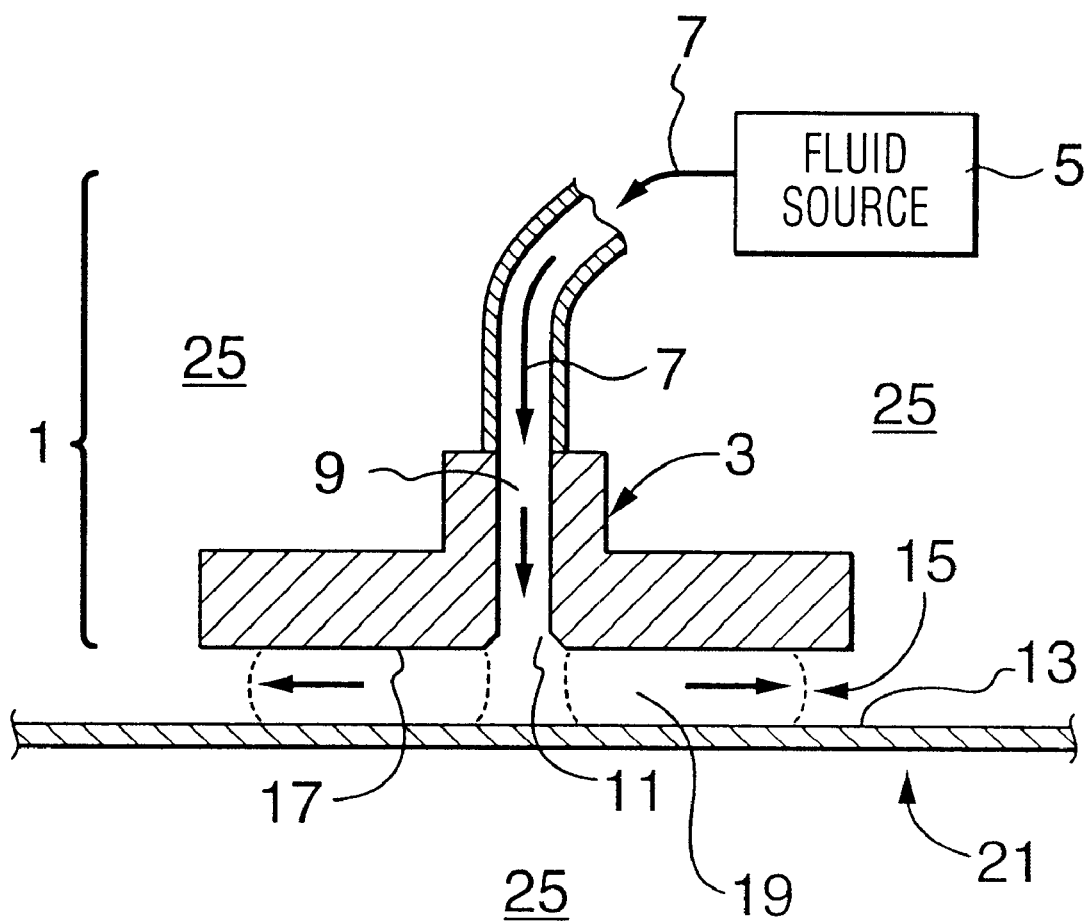
FIG. 1 is a simplified cross-sectional view of a prior art Bernoulli pickup.
Figure 2C:
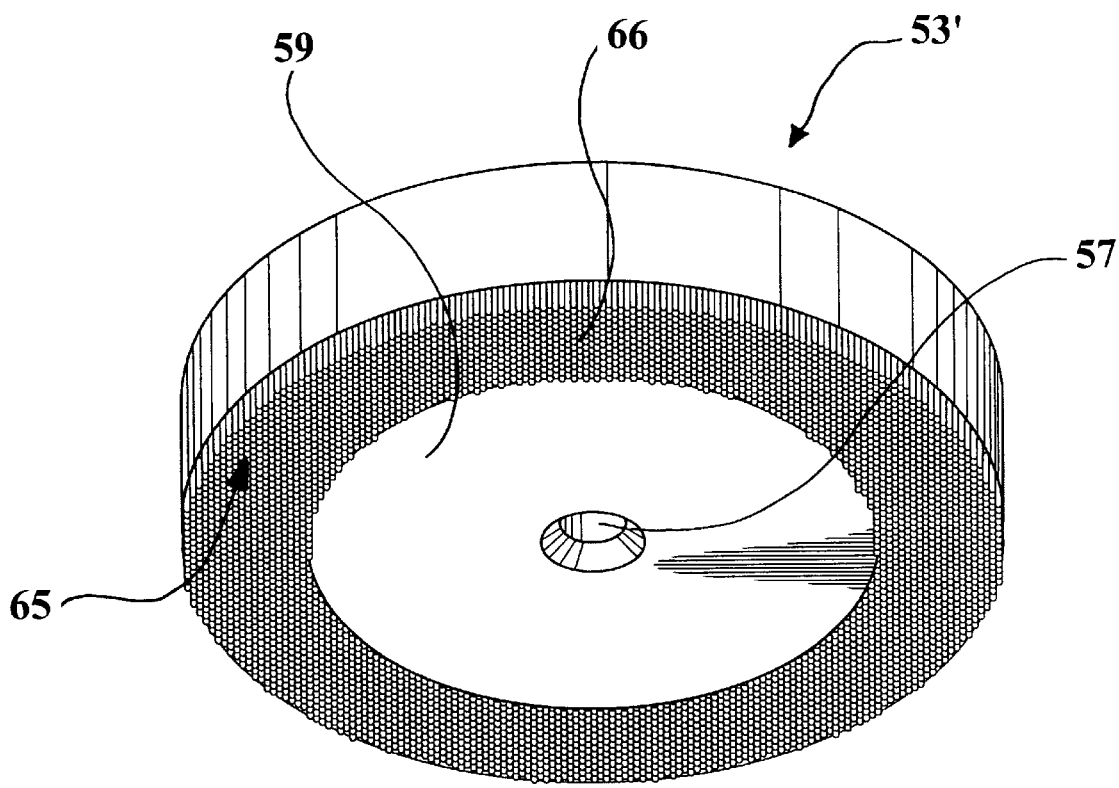
Figure 2D:
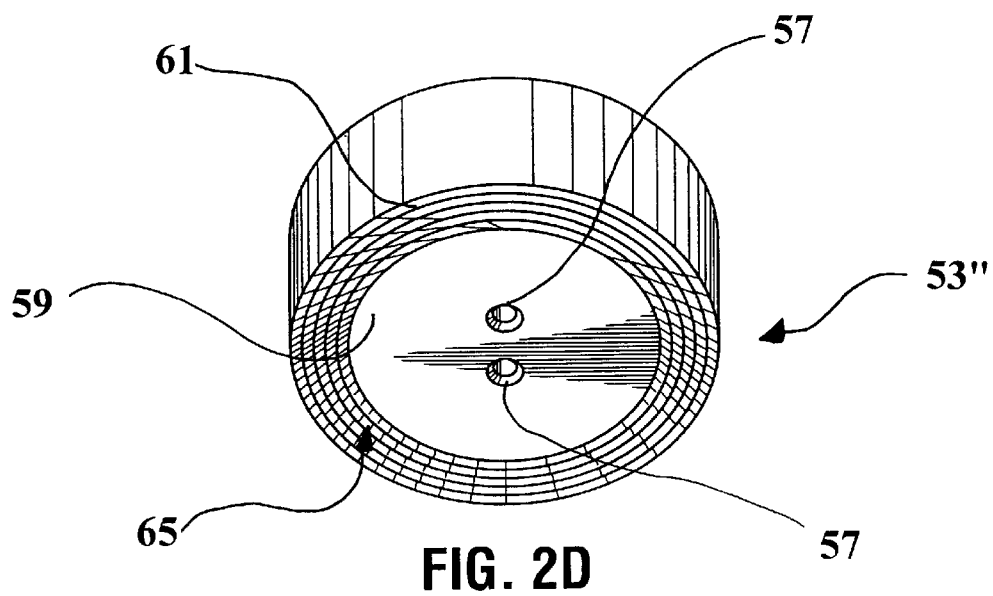

FIG. 2C shows a pickup head 53' in which the features which disrupt the build-up of mechanical vibrations in object 21 (see FIG. 1) comprise bristles 66.

Note that the maximization of laminar flow need not be the only means by which the pressure differential may be maximized or maintained, although the above embodiment is preferred for reasons such as ease of manufacture. In alternative embodiments, other means of maintaining or augmenting the pressure differential between gap 15 and surrounding medium 25 could also be incorporated, including surface features such as dimples or cavities that create pockets of lowered pressure in the manner described by U.S. Pat. No. 5,067,762 and U.S. Pat. No. 4,969,676. These features may be expected to disrupt the overall laminar flow of pickup fluid 7 over Bernoulli lift zone 59, but may nevertheless create pressure differentials that can be used to produce lift. Additional means of enhancing the desired pressure differentials will be apparent to those skilled in the art.

Vibration attenuation zone 65 is a surface characterized by one or more features that disrupt the build-up of mechanical vibrations in object 21. In the preferred embodiment, vibration attenuation features 61 comprise a series of closely spaced, evenly distributed, sharp concentric ridges located near the outer periphery of pickup face 63. For a pickup face containing an orifice of about 1.8 mm in diameter and a pickup fluid feed rate of about 70 standard liters per minute, at least 9 such ridges are preferred. These ridges disrupt the build-up of vibrations generated when pickup fluid 7 is forced to flow through gap 15. One possible mechanism of operation for the ridges is the increased likelihood of turbulent flow patterns in the region bounded by vibration attenuation zone 65 and object surface 13. The ridges may also create pockets or columns of pickup fluid with varying stiffnesses, which could also interfere with the propagation of unwanted vibrations. In any case, vibration attenuation zone 65 functions to eliminate or reduce the unwanted sounds produced by the flow of pickup fluid 7 through space 15.

According to the method of the invention, the lateral extent of the first flow surface, Bernoulli lift zone 59, is defined relative to the limits of the low-pressure zone associated with the flow of pickup fluid 7 through gap 15. Note that in this disclosure, when referring to characteristics of the Bernoulli pickup surface, the location and size (extent) of the low-pressure zone is defined in terms of the part of the low-pressure zone that is immediately adjacent to the pickup surface, although it is understood that the low-pressure zone is in fact a volume in three-dimensional space. For the purposes of describing the dimensions, boundaries, and location of the low-pressure zone with respect to the size of pickup features relative to the low-pressure zone, only the part of the low-pressure zone adjacent to the pickup surface is relevant.

As noted in the background to the invention, the limits of the low pressure zone created by the flow of pickup fluid 7 do not necessarily coincide with the physical boundaries of pickup face 63, nor are they necessarily defined by the limits of Bernoulli lift zone 59. The low-pressure zone may in fact be substantially smaller than Bernoulli lift zone 59, but this size difference must be minimized in order for the invention work most efficiently. Ideally then, vibration attenuation zone 65 starts at the outermost periphery of the low-pressure zone created by the flow of pickup fluid 7, such that fluid 7 flows through vibration attenuation zone 65 only after the it has passed through the low-pressure zone. In this way, sound attenuation can be achieved while taking maximal advantage of the low pressure created by Bernoulli pickup 51.

Thus, in the preferred embodiment, the size and lateral extent of Bernoulli lift zone 59 are chosen to maximize the coincidence of the lateral extent of Bernoulli lift zone 59 with the maximal lateral limits of the low-pressure zone created by the flow of pickup fluid 7, while also minimizing the portion of Bernoulli lift zone 59 lying outside of the maximal lateral limits of the low-pressure zone. The expected value of the maximal lateral limit of the low-pressure zone may be based on the expected conditions and parameters of operation for a given system. The exact dimensions of the maximal extent of the low-pressure zone will depend upon various factors, such as the pressure of pickup fluid 7 and the diameters and shapes of pickup shaft 55 and orifice 57. For a particular combination of characteristics for Bernoulli pickup 51, the preferred measurements for Bernoulli lift zone 59 can be determined empirically by measuring the pressure within gap 15 at various distances from the orifice 57. As vibration attenuation features 61 will tend to interfere with the generation of Bernoulli lift, such measurements should generally be performed with a pickup having a face lacking such features. The required values could also be calculated. The lateral extent of Bernoulli lift zone 59 should be at least equal to the lateral limit of the low-pressure zone created by the flow of pickup fluid 7 under the desired conditions of operation. For the preferred embodiment, the Bernoulli lift zone radius is approximately 9 mm for an orifice diameter of 1.8 mm.

Note that while the preferred embodiment of the invention employs a Bernoulli lift zone 59 that is essentially circular in outline, the Bernoulli lift zone nay have different shapes in alternative embodiments. This is because the shapes of the zones of low pressure may be modified by factors such as the presence of additional pickup orifices, the shapes of the orifices themselves, the shapes of the pickup surfaces or the shape and location of any surface features. Thus, while the preferred embodiment of the Bernoulli pickup in this invention has a pickup face that is substantially circular with a single pickup orifice located at its center. alternative embodiments of the invention could include, in varying combinations, pickup heads of different shapes, including substantially non-circular shapes, with multiple or non-centered orifices.

It is also preferable to ensure that the highest points of the two functional regions, Bernoulli lift zone 59 and vibration attenuation zone 65, are at equivalent heights (relative to surface 21), such that, for a pickup face 63 with a planar Bernoulli lift surface 59, the topmost points of the vibration attenuation features of the embodiment, sharp ridges 61, are level with the planar surface presented by Bernoulli lift surface 59. Alternative embodiments employing curved or sloped pickup faces may be useful for manipulating objects with curved or sloped surface profiles; the outermost limits of the projections on these surfaces should be similarly even, such that no one projection stands proud relative to the other projections or Bernoulli lift surface 59.

For the preferred embodiment, the surface off Bernoulli pickup face 63 is thus polished to present a smooth face without burrs or protuberances. The polishing helps to ensure that pickup face 63 is without prominences that could mar the surface 13 of lithographic printing plate 21 despite the presence of gap 15 between surface 13 and pickup face 63. The smooth, polished surface of Bernoulli lift surface 59 on pickup face 63 is also less susceptible to unwanted turbulent flow of pressurized gas 7, which tends reduce the effectiveness of the Bernoulli pickup. To further reduce the possibility of turbulent airflow over Bernoulli lift surface 59, the edges of orifice 57 are smoothly curved to further reduce the occurrence of turbulence-inducing sharp edges.

The preferred material for Bernoulli pickup head 53 is a metal such as aluminum, steel, or brass. Brass is especially preferred for its low cost and machinability. In an alternative embodiment of the present invention, Bernoulli pickup head 53 is made of Teflon, with concentric, sharp circular ridges 61 at the periphery of the pickup face 63. Alternatively, Bernoulli pickup head 53 could be made of rubber, closed-cell foam, or plastic, as long as the pickup face 63 has at least one vibration attenuation feature 61. Even glass may have some advantageous characteristics as a pickup head material, particularly with respect to making a very smooth surface possible for Bernoulli lift surface 59. A given Bernoulli pickup head may also include additional features to reduce marring, such as protective surface materials or coatings on the outermost parts of the pickup head. Thus, a pickup head fashioned according to the method of the present invention could also include a mar-prevention feature such as a protective ring of a non-scratching material (e.g., Teflon) on the outermost edges of the head, thus reducing the likelihood of scratches caused by incidential contact between sensitive surfaces and the Bernoulli pickups. The particular materials used to make the pickup head are less relevant than their suitability for forming the various features necessary for the operation of the invention. Thus, still other embodiments of the present invention may employ different materials for different parts of pickup head 53 in order to maximize the performance of each part.

The exact characteristics of vibration attenuation zone 65 may also be varied. One such embodiment, for example, is a Bernoulli pickup with a vibration attenuation zone comprising a pad of a soft, rough-surfaced fibrous material such as felt. The Bernoulli lift surface 59 would still be composed of a hard material such as brass. Those skilled in the art will also recognize that other suitable surface textures may be employed, including bristles, bumps, or other multiple discrete protuberances; unevenly distributed, non-continuous, or wavy ridges; or irregularly spaced ridges, grooves, or protuberances. All of these textural features produce variations in the surface profile of the vibration attenuation zone. Alternatively, vibration attenuation zone 65 could lack any obvious surface texturing, but consist of one or more zones of materials with differing vibration-damping characteristics. Vibration attenuation zone 65 could also be composed of a single material with excellent vibration damping characteristics; for instance, a soft rubbery material that absorbs and dissipates the energy of mechanical impact with minimal elastic deformation. Polynorbornene, for example, is a synthetic elastomer that tends to absorb mechanical impact and dissipate the energy as heat, rather than kinetic energy. The only requirement is that the surface characteristics of vibration attenuation zone 65 will interfere with the generation and propagation of unwanted mechanical vibrations while still allowing the passage of pickup fluid 7 through gap 15 to surrounding medium 25.

In the preferred embodiment of the invention, two Bernoulli pickups of type described above are used to handle a large, substantially rigid object such as a lithographic printing plate. This number of manipulators balances the requirement for stable support of the object with need to keep pressurized fluid consumption at acceptable levels, while also minimizing the complexity of the handling mechanism. Other numbers of pickups could of course be employed.

The present invention has been developed with the intent of using it within the context of the lithographic printing industry, but it should be clear that the invention is appropriate for any context where a method for the contactless handling of materials is desirable. The method of the invention should be considered particularly suitable for any industry that requires the handling of large, sheet-like objects with delicate or sensitive surfaces, especially if the materials comprising the objects are capable of elastic deformations that can maintain and amplify mechanical vibrations. The method of the invention is more widely suitable, however, and could be used with any object that presents a surface susceptible to the lifting action of the Bernoulli pickups.

It should also be noted that, in the preferred embodiment of the invention, pickup fluid 7 is compressed air, as this is a readily available and cheap source of gas commonly used to operate printing machines. However, alternative embodiments of the invention, including embodiments of the invention suitable for other industrial purposes, could employ other pressurized fluids, including other gases such as nitrogen or carbon dioxide. Such gases may be employed in situations where using ordinary compressed air may be undesirable, possibly due to the possibility of contaminants or the presence of reactive components such as oxygen.

What is claimed is:

1. A method for contactless handling of an object within a surrounding fluid medium, said method comprising:

establishing a flow of pickup fluid between a manipulator surface and at least a portion of a surface of said object and thereby creating a pressure differential between said surrounding fluid medium and said flow of pickup fluid in a lowú pressure zone;

flowing said pickup fluid over a first flow surface of said manipulator surface, said first flow surface being located so as to at least substantially coincide with the low-pressure zone;

disrupting a buildúup of mechanical vibrations in said object by flowing said pickup fluid over a vibration attenuation surface comprising at least one material capable of converting at least a substantial part of a kinetic energy of a mechanical impact into another form of energy;

whereby said object may be manipulated without requiring contact therewith.

2. A method for reducing mechanical vibration in an object handled with a Bernoulli pickup, said method comprising;

disrupting mechanical vibrations as a pickup fluid passes between a pickup face and an opposing surface of said object by providing a vibration attenuation surface located on said pickup face outside of a lowúpressure zone created by operation of said Bernoulli pickup, said low-pressure zone located such that its maximal lateral limits substantially coincide with a lateral extent of a first flow surface on said pickup face, wherein said disruption of mechanical vibrations is effected by forcing said pickup fluid to flow over said vibration attenuation surface, said vibration attenuation surface comprising at least one material capable of converting at least a substantial part of a kinetic energy of a mechanical impact into another form of energy.

3. A method as in claim 2, wherein said first flow surface is substantially smooth and projection-free.

4. A Bernoulli type pickup device having a pickup head comprising:

at least one pickup face with at least one orifice therein;

a first flow surface proximate to said at least one orifice, an area of said first flow surface being located so as to substantially coincide with a low-pressure zone created by a pickup fluid flowing from said at least one orifice during operation of said pickup device;

a vibration attenuation surface comprising at least one material capable of converting at least a substantial part of a kinetic energy of a mechanical impact into another form of energy.

5. A pickup device as in claim 4, wherein said first flow surface is substantially smooth and projection-free.

6. A method as in claim 4, wherein the at least one material comprises a rubber material.

7. A method as in claim 6, wherein the rubber material comprises polynorborene.

8. A method for contactless handling of an object within a surrounding fluid medium, said method comprising:

establishing a flow of a pickup fluid between a manipulator surface and at least a portion Of a surface of said object;

creating a pressure differential between said surrounding fluid medium and said flow of pickup fluid in a low úpressure zone associated with said manipulator surface;

flowing said pickup fluid over a first flow surface, said first flow surface being located so as to at least substantially coincide with the low-pressure zone and being dimensioned such that a lateral extent of said first flow surface extends to at least a maximal lateral limit of the low-pressure zone;

disrupting a build-up of mechanical vibrations in said object outside the lateral extent of said first flow surface by flowing said pickup fluid over a vibration attenuation surface comprising at least one material capable of converting at least a substantial part of a kinetic energy of a mechanical impact into another form of energy.

9. A method as in claim 8, wherein said first flow surface is substantially smooth and projection-free.

10. A pickup device comprising:

a pickup face; and an orifice in the pickup face, the orifice operative to introduce a fluid flow between the pickup face and a surface of an object;

wherein the pickup face comprises:

a substantially planar first surface extending outwardly from a perimeter of the orifice; and an outer surface extending outwardly from the first surface to a perimeter of the pickup face, the outer surface comprising a plurality of sharp ridges having sharp edges in a plane of the first surface.

11. A pickup device according to claim 10, wherein the sharp ridges are defined between a plurality of concentric grooves in the outer surface.

12. A pickup device according to claim 11, wherein there are nine or more concentric grooves in the outer surface.

13. A pickup device according to claim 11, wherein the concentric grooves are substantially triangular in cross-sectional profile.

14. A pickup device according to claim 10, wherein the outer surface comprises a region of non-scratching material at an outermost edge thereof.

15. A pickup device according to claim 10, wherein the orifice is centered in the pickup face.

16. A pickup device according to claim 15, wherein each of the sharp ridges comprises a face extending in a direction substantially orthogonal to tho plane of the first surface.

17. A pickup device according no claim 15, wherein the sharp ridges are defined between a plurality of concentric grooves in the outer surface and the concentric grooves are centered on the orifice.

18. A pickup device according to claim 10, comprising a plurality of orifices in a lowermost region of the pickup face, the plurality of orifices operative to introduce a fluid flow between the pickup face and the surface, of the object.

19. A pickup device comprising:

a pickup face; and an orifice in the pickup face, the orifice operative to introduce a fluid flow between the pickup face and a surface of an object;

wherein the pickup face comprises:

a smooth substantially planar first surface extending outwardly from a perimeter of the orifice, an outward extent of the first surface approximately five times greater than an outward extent of the orifice; and an outer surface extending outwardly from the first surface to a perimeter of the pickup face, the outer surface comprising one or more vibration attenuation features.

20. The pickup device of claim 19, wherein the orifice and first surface are each circular.

21. A pickup device according to claim 19, wherein the one or more vibration attenuation features comprise bristles on the outer surface.

22. A pickup device according to claim 19, wherein the one or more vibration attenuation features comprise a plurality of ridges on the outer surface, the ridges having sharp edges lying in a plane of the first surface.

23. A pickup device according to claim 19, wherein the outer surface is covered with a fibrous material.

24. a pickup device according to claim 23, wherein the fibrous material comprises felt.

25. A pickup device according to claim 19, wherein the one or more vibration attenuation features comprise a plurality of features selected from at least one of: ridges, bumps, grooves, cavities, protuberances, fibrous materials, regions containing bristles.

26. A pickup device according to claim 19, wherein the vibration attenuation features are defined between a plurality of concentric grooves in the outer surface.

27. A pickup device according to claim 26, wherein the outer surface has nine or more concentric grooves.

28. A pickup device according to claim 26, wherein the concentric grooves are substantially triangular in cross usectional profile.

29. A pickup device according to claim 19, wherein the outer surface comprises a region of a non-scratching material at an outermost edge thereof.

30. A pickup device according to claim 19, wherein the orifice is centered in the pickup face.

31. A pickup device according to claim 19, comprising a plurality of orifices in a lowermost region of the pickup face, the plurality of orifices operative to introduce a fluid flow between the pickup face and the surface of the object.

32. A method for handling an object in a surrounding fluid medium, the method comprising:

providing an orifice in a substantially planar first surface of a pickup face, the first surface extending outwardly from a perimeter of the orifice;

ejecting fluid from the orifice to establish a flow of fluid between the pickup face and a surface of the object, the flow of fluid creating a pressure differential between the surrounding fluid medium and a low-pressure zone located between the pickup face and the surface of the object;

allowing the fluid to flow outwardly over one or more sharp edged ridges on an outer surface of the pickup face, the outer surface extending outwardly from the first surface.

33. A method according to claim 32, wherein an outer perimeter of the low-pressure region is within a perimeter of the first surface.

34. A method according to claim 32, wherein each of the ridges has at least one face extending in a direction orthogonal to a plane of the first surface.

35. A method according to claim 32, wherein the one or more ridges are defined between a plurality of concentric grooves in the outer surface.

36. A method according to claim 32, wherein the object is a printing plate and the method comprises maintaining sonic emissions produced during handling of the printing plate at less than 110 db.

37. A method for handling an object in a surrounding fluid medium, the method comprising:

providing an orifice in a substantially planar pickup face;

ejecting fluid from the orifice;

allowing the fluid to flow outwardly from the orifice between a smooth portion of the pickup face and a surface of the object for a distance of approximately five times a diameter of the orifice;

the flow of fluid creating a pressure differential between the surrounding fluid medium and a low-pressure zone located between the pickup face and the surface of the object;

allowing the fluid to continue to flow outwardly over one or more vibration attenuation features in an outer surface of the pickup face, the outer surface extending outwardly from the first surface to a perimeter of the pickup face.

38. A method according to claim 37, wherein the vibration attenuation features comprise bristles.

39. A method according to claim 37, wherein the vibration attenuation features comprise sharp edged ridges.

* * * * *